(12) United States Patent
Yoon et al.

(10) Patent No.: US 7,447,559 B2
(45) Date of Patent: Nov. 4, 2008

(54) APPARATUS AND METHOD OF FORMING A PHOTORESIST PATTERN, AND REPAIR NOZZLE

(75) Inventors: Gi-Cheon Yoon, Soongnom-si (KR); Geun-Soo An, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 609 days.

(21) Appl. No.: 10/960,192

(22) Filed: Oct. 6, 2004

(65) Prior Publication Data

US 2005/0112507 A1    May 26, 2005

(30) Foreign Application Priority Data

Oct. 8, 2003    (KR) .................... 10-2003-0069924

(51) Int. Cl.
*G03D 3/00*    (2006.01)
(52) U.S. Cl. .................... 700/121; 700/108; 700/109; 700/110; 700/120
(58) Field of Classification Search .................... 355/27, 355/40; 134/61, 64 P, 104.2, 113; 396/524; 349/4; 118/669, 712, 670, 620; 700/121, 700/120, 108–110
See application file for complete search history.

(56) References Cited

U.S. PATENT DOCUMENTS 5,844,662 A * 12/1998 Akimoto et al. ................ 355/27
2001/0004066 A1 * 6/2001 Toshima et al. ................ 216/13
2003/0016349 A1 * 1/2003 Tsumura et al. .......... 356/237.2

FOREIGN PATENT DOCUMENTS

JP    04-106949    * 4/1992
KR    2003089929    * 11/2003

OTHER PUBLICATIONS

JP 04-106949, English Machine Translation, Abstract Only.*

* cited by examiner

*Primary Examiner*—Mark F Huff
*Assistant Examiner*—Caleen O Sullivan
(74) *Attorney, Agent, or Firm*—MacPherson Kwok Chen & Heid LLP

(57) ABSTRACT

In an apparatus and a method of forming a photoresist pattern, a photoresist-coating section coats a substrate with a photoresist composition to form a photoresist film. A light is irradiated onto the photoresist film by using an exposure section, and a developing section develops the photoresist film. A residue-sensing section senses a residue of the developed photoresist film to generate information of the residue corresponding to the sensed residue. A residue-removing section sprays a solvent in a region of the residue corresponding to the information of the residue to dissolve the residue, and the residue-removing section absorbs the residue dissolved by the solvent. Therefore, the residue is effectively removed by spraying the solvent in the region of the residue and absorbing the residue dissolved by the solvent.

9 Claims, 5 Drawing Sheets

APPARATUS AND METHOD OF FORMING A PHOTORESIST PATTERN, AND REPAIR NOZZLE

CROSS-REFERENCE TO RELATED APPLICATIONS

This application relies for priority upon Korean Patent Application No. 2003-69924 filed on Oct. 8, 2003, the contents of which are herein incorporated by reference in its entirety.

BACKGROUND OF THE INVENTION

1. Field of the Invention

The present invention relates to an apparatus for forming a photoresist pattern, a method of forming a photoresist pattern using the apparatus for forming the photoresist pattern, and a repair nozzle. More particularly, the present invention relates to an apparatus for forming a photoresist pattern, which is capable of efficiently removing a residue to form a photoresist pattern, a method of forming a photoresist pattern using the apparatus for forming the photoresist pattern, and a repair nozzle.

2. Description of the Related Art

A liquid crystal display (LCD) device has been widely utilized due to various characteristics such as a thin thickness, a lightweight, a low power consumption and a low driving voltage. In addition, the LCD device is capable of displaying a high quality image. Thus, the LCD device is widely used in various electronic apparatuses.

The LCD device includes a thin film transistor (TFT) substrate, a color filter substrate and a liquid crystal layer. The TFT substrate includes a plurality of the TFTs that operate as a switching device and pixel electrodes. The color filter substrate includes color filters and common electrodes. The liquid crystal layer is interposed between the TFT substrate and the color filter substrate. In order to form the TFTs or the pixel electrodes on the TFT substrate, and the color filters or the common electrodes on the color filter substrate, a photoresist pattern is formed.

A photoresist composition is coated on a thin film to form a photoresist film. The thin film is formed on a TFT substrate or a color filter substrate. A light is irradiated onto the photoresist film through a mask having a pattern.

Then, the exposed photoresist film is dipped in a developing solution, and a portion of the photoresist film is removed to form the photoresist pattern. When the photoresist composition is a positive type, a portion of the photoresist film where the light is irradiated is removed, whereas a portion of the photoresist film where the light is not irradiated remains. However, when the photoresist composition is a negative type, the portion of the photoresist film where the light is not irradiated is removed and the portion of the photoresist film where the light is irradiated remains.

A photoresist pattern having a desired shape is formed through the above-mentioned process. The TFTs, the color filters and the like may be formed on the photoresist pattern.

After the development process, an after-development inspection (ADI) process is performed. In the ADI process, the photoresist film is inspected whether the photoresist pattern has a defection.

In a conventional technique, a rework process may be performed to remove a residue that corresponds to the defection. That is, the photoresist film is entirely stripped, and a new photoresist pattern is formed again through the above-mentioned processes. A new photoresist pattern is reformed through additional exposure process and additional development process.

When a size of a mother substrate increases, and the defection corresponding to the residue is also increased.

Therefore, a manufacturing efficiency of the LCD apparatus is decreased.

SUMMARY OF THE INVENTION

The present invention provides an apparatus for forming a photoresist pattern, capable of effectively removing a residue of a photoresist pattern.

The present invention also provides a method of forming the photoresist pattern using the above-mentioned apparatus for forming the photoresist pattern.

The present invention also provides a repair nozzle efficiently removing a residue of a photoresist.

An apparatus for forming a photoresist pattern in accordance with an aspect of the present invention includes a photoresist-coating section, an exposure section, a developing section, a residue-sensing section and a residue-removing section.

The photoresist-coating section coats a substrate with a photoresist composition to form a photoresist film. The exposure section selectively irradiates a light onto the photoresist film. The developing section develops the photoresist film. The residue-sensing section includes a substrate-scanning section that scans the substrate having the developed photoresist film thereon to sense a residue and an image server that generates information of the residue based on a scanned image from the substrate-scanning section to output the information of the sensed residue. The residue-removing section removes the residue by using the information of the residue.

A method of forming a photoresist pattern in accordance with another aspect of the present invention is provided. A photoresist composition is coated to form a photoresist film. A light is selectively irradiated onto the photoresist film. The photoresist film is developed. A residue of the developed photoresist film is sensed to generate information of the sensed residue. The residue is removed by using the information of the residue.

A repair nozzle in accordance with still another aspect of the present invention includes a spray hole and an absorbing hole. The spray hole sprays a solvent of a photoresist in a region of the residue of the photoresist pattern. The absorbing hole absorbs the residue dissolved by the solvent.

With the above exemplary embodiments, the residue is effectively removed by spraying the solvent of the photoresist in the region of the residue and absorbing the residue dissolved by the solvent.

BRIEF DESCRIPTION OF THE DRAWINGS

The above and other advantages of the present invention will become readily apparent by reference to the following detailed description when considered in conjunction with the accompanying drawings wherein.

DESCRIPTION OF PREFERRED EMBODIMENTS

Hereinafter, the best mode of the present invention will be described in detail with reference to the accompanying drawings.

Figure 1:
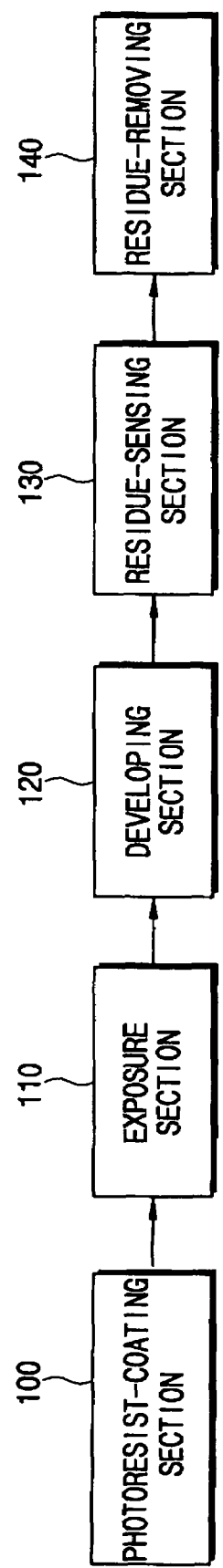
FIG. 1 is a block diagram illustrating a structure of an apparatus for forming a photoresist pattern in accordance with an exemplary embodiment of the present invention.
Figure 2:
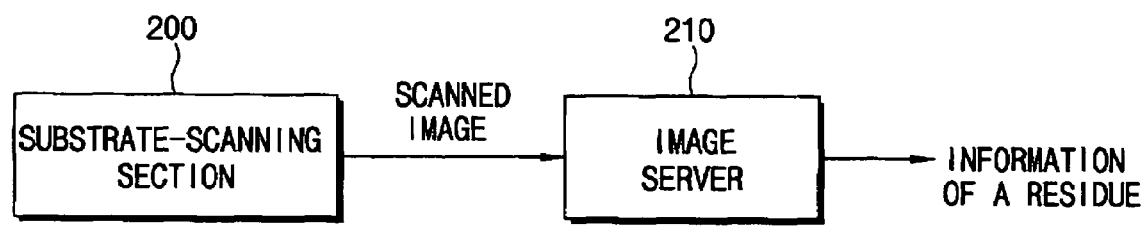
FIG. 2 is a block diagram illustrating a residue-sensing section shown in FIG. 1.
Figure 3:
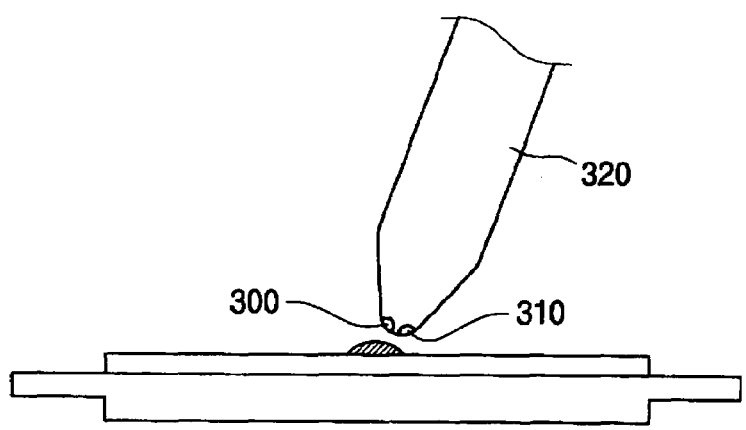
FIG. 3 is a cross-sectional view illustrating a residue-removing section shown in FIG. 1.

FIG. 1 is a block diagram illustrating a structure of an apparatus for forming a photoresist pattern in accordance with an exemplary embodiment of the present invention. FIG. 2 is a block diagram illustrating a residue-sensing section shown in FIG. 1. FIG. 3 is a cross-sectional view illustrating a residue-removing section shown in FIG. 1.

Referring to FIG. 1, an apparatus for forming a photoresist pattern of an LCD device includes a photoresist-coating section 100, an exposure section 110, a developing section 120, a residue-sensing section 130 and a residue-removing section 140.

The photoresist-coating section 100 coats a substrate (not shown) with a photoresist composition to form a photoresist film. The exposure section 110 selectively irradiates a light onto the photoresist film through a mask having a pattern. The developing section 120 develops the photoresist film. The residue-sensing section 130 senses a residue of the photoresist film that is patterned through an exposure process and a developing process. The residue-removing section 140 removes the residue.

The residue is a redundancy of the photoresist film, and may not be removed by the developing process.

As shown in FIG. 2, the residue-sensing section 130 includes a substrate-scanning section 200 and an image server 210.

The substrate-scanning section 200 scans the substrate having the photoresist film thereon formed by the exposure process and the developing process. The image server 210 generates information of the residue based on the image of the substrate scanned by the substrate-scanning section 200, so that the image server 210 outputs the information to the residue-removing section 140. The information of the residue includes a position, a size and a substrate identification (a substrate ID) of the residue. The substrate ID represents discrimination information of one of TFT substrates or color filter substrates formed on a mother substrate.

As shown in FIG. 3, the residue-removing section 140 includes a repair nozzle 320 having a spray hole 300 and an absorbing hole 310.

A solvent of a photoresist is sprayed through the spray hole 300 in a region of the residue at high pressure by using the information of the residue. The residue dissolved by the solvent is absorbed through the absorbing hole 310.

Hereinafter, an operation of an apparatus for forming a photoresist pattern in accordance with an exemplary embodiment of the present invention will be described in detail with reference to FIGS. 4A through 4D.

FIGS. 4A to 4D are cross-sectional views illustrating a method of forming a photoresist pattern in accordance with an exemplary embodiment of the present invention.

Figure 4A:
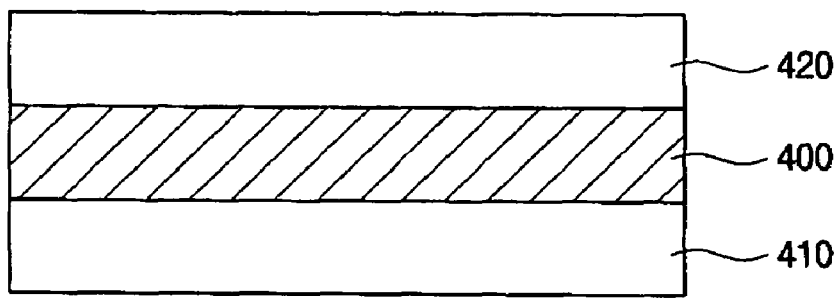
FIGS. 4A to 4D are cross-sectional views illustrating a method of forming a photoresist pattern in accordance with an exemplary embodiment of the present invention.

As shown in FIG. 4A, a photoresist-coating section 100 coats a substrate 410 having a layer 400 thereon with a photoresist composition to form a photoresist film 420. The photoresist composition may be coated by using a method such as a dipping, a spraying, a rotation, a spin coating, etc. The layer 400 may be a TFT or a pixel electrode on a TFT substrate, and the layer 400 may be a color filter or a common electrode on a color filter substrate. The photoresist composition is negative type in the present embodiment. Alternatively, the photoresist composition may be a positive type.

Figure 4B:
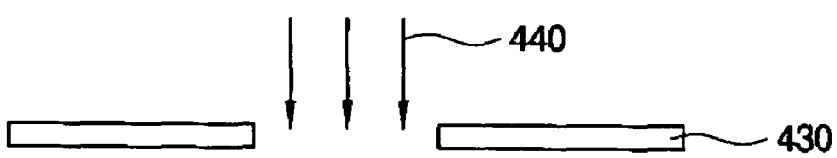
Figure 4B:
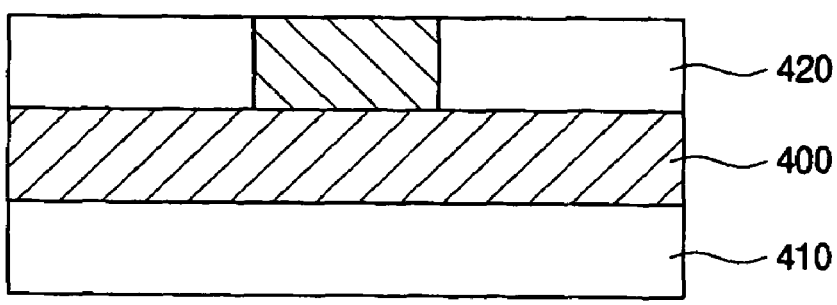

As shown in FIG. 4B, the exposure section 110 selectively irradiates a light onto the photoresist film 420 by using a mask 430 having a pattern. The light may be an ultraviolet ray 440.

Figure 4C:
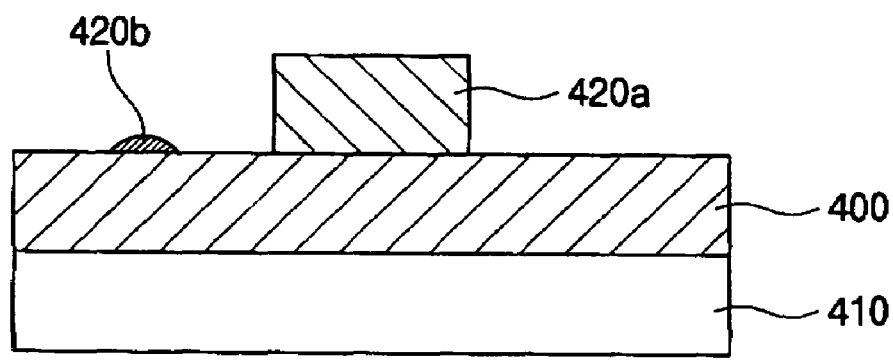

As shown in FIG. 4C, the developing section 120 dips the substrate 410 having the photoresist film 420 thereon in a developing solution to selectively remove the photoresist film 420. Thus, a desired photoresist pattern 420a is formed.

In the present embodiment, the photoresist composition is the negative type so that a portion where the light is not irradiated is removed by the developing solution. Alternatively, the photoresist composition may be the positive type so that a portion where the light is irradiated is removed by the developing solution.

After the developing process, a residue may remain on the layer 400.

The residue-sensing section 130, as shown in FIG. 4C, scans the substrate 410 having the residue 420b, and outputs the scanned image of the substrate 410 to the image server 210. The image server 210 recognizes the residue 420b from the scanned image to generate information of the residue 420b. The information of the residue 420b includes a position, a size and a substrate ID of the residue 420b. The image server 210 outputs the information of the residue 420b to the residue-removing section 140.

The residue-removing section 140 includes a repair nozzle 320 having a spray hole 300 and an absorbing hole 310. A solvent of a photoresist is sprayed into a region of the residue 420b through the spray hole 300 at high pressure by using the information of the residue 420b. The residue 420b dissolved by the solvent is absorbed through the absorbing hole 310.

The repair nozzle 320 sprays the solvent of the photoresist in the region of the residue 420b through the spray hole 300 by using the information of the residue 420b. A spray region where the solvent is sprayed may preferably be varied in accordance with the size of the residue 420b. The spray region corresponds to the region of the residue 420b. In the present embodiment, the spray region of the solvent of the photoresist may be controlled by controlling a size and a spray pressure of the spray hole 300. Therefore, the residue-removing section 140 including the repair nozzle 320 may control the size and the spray pressure of the spray hole 300 in accordance with the size of the residue 420b to control the spray region of the solvent of the photoresist.

Figure 4D:
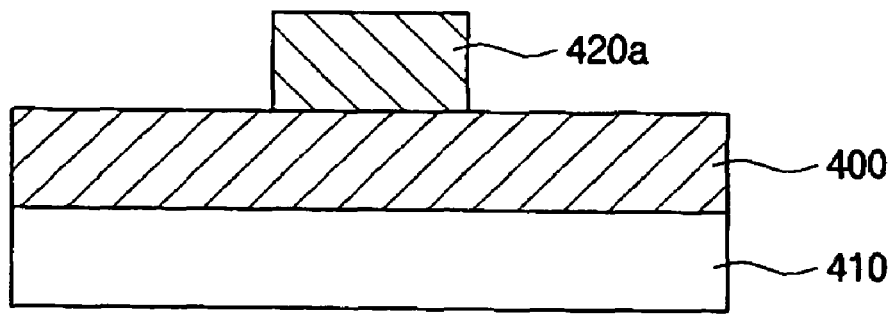

Additionally, the repair nozzle 320 absorbs the residue 420b dissolved by the solvent of the photoresist through the absorbing hole 310 to form a desired photoresist pattern 420a as shown in FIG. 4D.

Hereinafter, a method of forming a photoresist pattern in accordance with an exemplary embodiment of the present invention will be described in detail with reference to the accompanying drawings.

Figure 5:
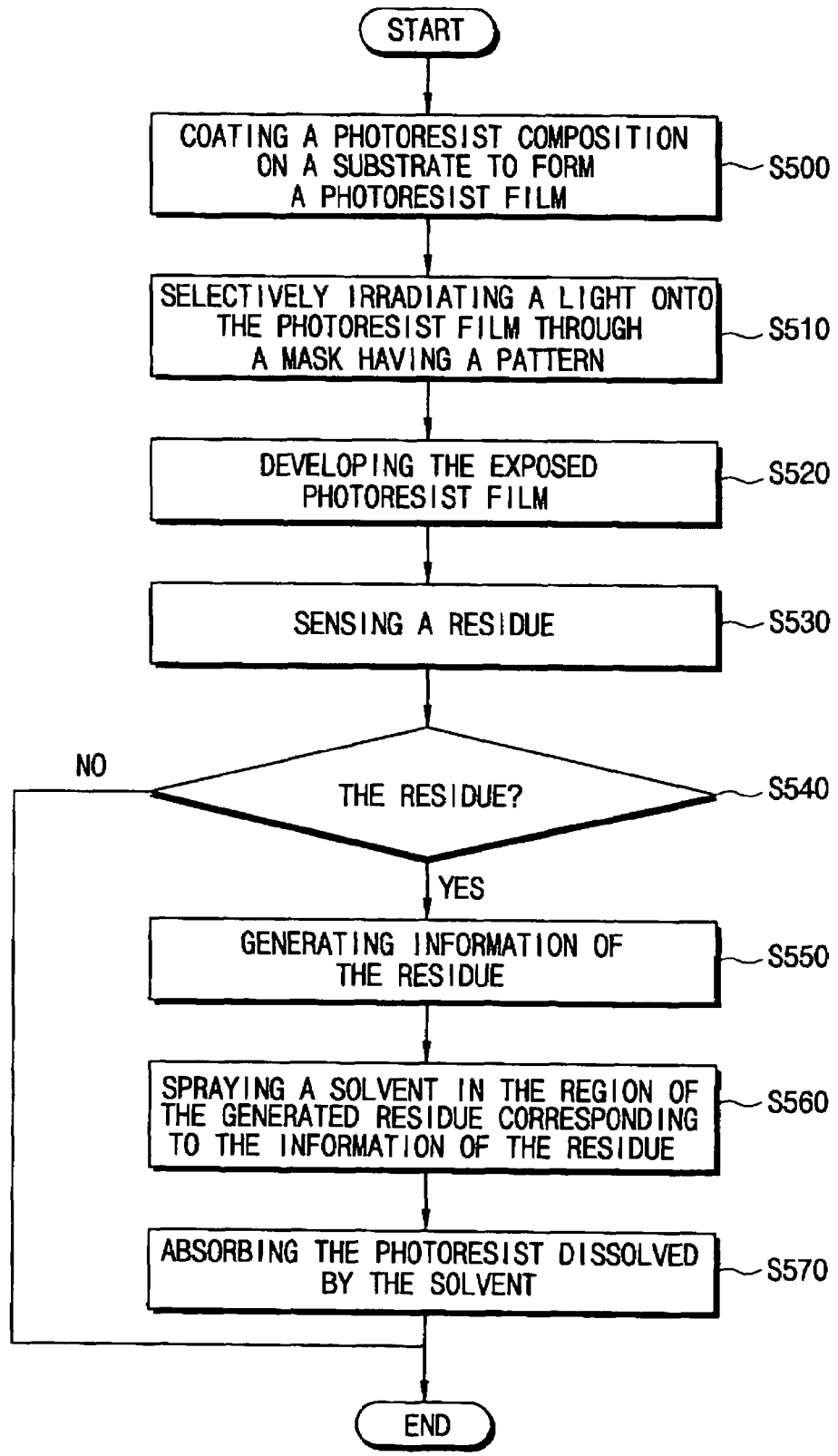
FIG. 5 is a flow chart illustrating a method of forming a photoresist pattern in accordance with an exemplary embodiment of the present invention.

FIG. 5 is a flow chart illustrating a method of forming a photoresist pattern in accordance with an exemplary embodiment of the present invention.

Referring to FIG. 5, in step S500, the photoresist-coating section 100 coats the substrate 410 with the photoresist composition to form the photoresist film. The photoresist film 420 is formed through a coating process, for example, such as a dipping, a spraying, a rotation, a spin coating, etc.

In step S510, the ultraviolet ray 440 is selectively irradiated onto the photoresist film 420 through the mask 430 having the pattern by using the exposure section 110. In step S520, the developing section 120 develops the photoresist film 420. That is, the developing section 120 dips the photoresist film 420 in the developing solution to selectively remove the portion where the light is irradiated or the portion where the light is not irradiated of the photoresist film 420.

In step S530, the residue-sensing section 130 senses the residue 420b. The residue-sensing section 130 scans the substrate 410 having the developed photoresist film 420 to sense the residue 420b from the scanned image of the substrate 410.

In step S550, when the residue 420b is sensed, the residue-sensing section 130 generates the information of the residue 420b based on the scanned image. The information of the residue 420b includes the position, the size and the substrate ID of the residue 420b. The residue-sensing section 130 outputs the information of the residue 420b to the residue-removing section 140.

In step S560, the residue-removing section 140 sprays the solvent in the region of the residue 420b in accordance with the information of the residue 420b.

In step S570, the residue-removing section 140 removes the residue 420b by absorbing the residue 420b dissolved by the sprayed solvent of the photoresist. The repair nozzle 320 includes the spray hole 300 and the absorbing hole 310 to remove the residue 420b. The repair nozzle 320 sprays the solvent of the photoresist through the spray hole 300, and the repair nozzle 320 absorbs the dissolved residue 420b through the absorbing hole 310.

As described above, an apparatus for forming a photoresist pattern sprays a solvent of a photoresist in a region of the residue, and removes the residue by absorbing the residue dissolved by the sprayed solvent of the photoresist.

Therefore, a rework process is unnecessary, and a stripping equipment for reworking and a photo line for recoating are also unnecessary. As the result, manufacturing costs of the photoresist pattern are reduced. That is, the residue is easily removed without a rework process. Thus, efficiency and yield of manufacturing an LCD device using the apparatus for forming the photoresist pattern have been improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An apparatus for forming a photoresist pattern on substrate, comprising:
   a developing section that develops a photoresist film;
   a residue-sensing section that includes a substrate-scanning section scanning the substrate having the developed photoresist film thereon to sense a residue which remains after the photoresist film is developed and an image server generating information of the residue comprising at least position information based on a scanned image from the substrate-scanning section to output the information of the sensed residue; and
   a residue-removing section that removes the residue by using the position information of the residue and that sprays a solvent in a region of the residue corresponding to the position information of the residue to dissolve the residue, and absorbs the residue dissolved by the solvent.

2. The apparatus of claim 1, wherein the information of the residue further comprises a size and a substrate identification (substrate ID) of the residue.

3. The apparatus of claim 1, wherein the residue-removing section comprises a repair nozzle configured to remove the residue.

4. The apparatus of claim 3, wherein the repair nozzle comprises:
   a spray hole having a controllable size that sprays the solvent at a controllable spray pressure; and
   an absorbing hole that absorbs the residue dissolved by the solvent.

5. The apparatus of claim 4, wherein a spray region where the solvent is sprayed is varied in accordance with a size of the residue.

6. The apparatus of claim 4, wherein a spray region where the solvent is sprayed is controlled by controlling a size and a spray pressure of the spray hole.

7. The apparatus of claim 1, wherein the substrate is a thin film transistor substrate or a color filter substrate of a liquid crystal display device.

8. The apparatus of claim 1, wherein the apparatus further comprises:
   a photoresist-coating section that coats the substrate with a photoresist composition to form the photoresist film, and
   an exposure section that selectively irradiates a light onto the photoresist film.

9. The apparatus of claim 4, wherein the spray hole and the absorbing hole both face the photoresist film on the substrate.

\* \* \* \* \*